(12) United States Patent
Buchanan et al.

(10) Patent No.: US 9,754,666 B2
(45) Date of Patent: Sep. 5, 2017

(54) RESISTIVE RATIO-BASED MEMORY CELL

(71) Applicant: HEWLETT PACKARD ENTERPRISE DEVELOPMENT LP, Houston, TX (US)

(72) Inventors: Brent E. Buchanan, Fort Collins, CO (US); Martin Foltin, Fort Collins, CO (US); Jeffrey A. Lucas, Fort Collins, CO (US); Clinton H. Parker, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/111,194

(22) PCT Filed: Jan. 31, 2014

(86) PCT No.: PCT/US2014/014051
§ 371 (c)(1),
(2) Date: Jul. 13, 2016

(87) PCT Pub. No.: WO2015/116144
PCT Pub. Date: Aug. 6, 2015

(65) Prior Publication Data
US 2016/0336063 A1    Nov. 17, 2016

(51) Int. Cl.
G11C 11/00    (2006.01)
G11C 13/00    (2006.01)

(52) U.S. Cl.
CPC ........ G11C 13/004 (2013.01); G11C 13/0069 (2013.01); G11C 2013/0042 (2013.01); G11C 2213/77 (2013.01)

(58) Field of Classification Search
CPC .................................................. G11C 13/0002
USPC .......................................................... 365/148
See application file for complete search history.

(56) References Cited

U.S. PATENT DOCUMENTS

| 6,862,211 | B2 | 3/2005 | Adelmann |
| 6,914,808 | B2 | 7/2005 | Inaba |
| 7,548,450 | B2 | 6/2009 | Aoki |
| 2006/0067098 | A1 | 3/2006 | Ferrant |
| 2006/0144165 | A1 | 7/2006 | Pietsch |
| 2006/0245227 | A1 | 11/2006 | Nazarian |
| 2007/0069273 | A1 | 3/2007 | Rohr |
| 2009/0161417 | A1 | 6/2009 | Fackenthal et al. |
| 2012/0033490 | A1* | 2/2012 | Rao .......................... G11C 11/16 365/171 |

(Continued)

FOREIGN PATENT DOCUMENTS

CN    103051307    4/2013
KR    20120000233    1/2012

OTHER PUBLICATIONS

Ascoli, A. et al.; "Memristor Models in a Chaotic Neural Circuit"; vol. 23; Issue: 3; Mar. 2013.

(Continued)

Primary Examiner — Hoai V Ho
(74) Attorney, Agent, or Firm — Trop, Pruner & Hu, P.C.

(57) ABSTRACT

An apparatus includes a first resistive storage element and a second resistive storage element. The first and second resistive storage elements are coupled to column lines to of a crosspoint array to form a memory cell; and a ratio of resistances of the first and second resistive storage elements indicates a stored value for the memory cell.

13 Claims, 9 Drawing Sheets

(56) References Cited

U.S. PATENT DOCUMENTS

| | | |
|---|---|---|
| 2012/0294075 A1 | 11/2012 | Toda |
| 2013/0119341 A1 | 5/2013 | Liu et al. |
| 2013/0121063 A1* | 5/2013 | Tsuji .................... H01L 27/101 |
| | | 365/148 |
| 2013/0135920 A1 | 5/2013 | Chevallier et al. |

OTHER PUBLICATIONS

International Search Report, dated Oct. 22, 2014; International Application PCT/US2014/014051; 3 pages.

\* cited by examiner

RESISTIVE RATIO-BASED MEMORY CELL

BACKGROUND

Semiconductor memory devices typically are used in a computer system for purposes of storing data related to the various operations of the system. The memory device may be packaged as a unit in a semiconductor package to form a "memory chip," and several such chips may be assembled together in the form of a module (a dual inline memory module (DIMM), for example), such that several modules may form, for example, the system memory of the computer system.

A computer system has traditionally contained both volatile and non-volatile storage devices. In this manner, due to their relatively faster access times, volatile memory devices, such as dynamic random access memory (DRAM) devices, have traditionally been used to form the working memory for the computer system. To preserve computer system data when the system is powered off, data has traditionally been stored in non-volatile mass storage devices associated with slower access times, such as magnetic media-based or optical media-based mass storage devices.

The development of relatively high density, solid state non-volatile memory technologies is closing the gap between the two technologies, and as such, non-volatile memory devices are becoming increasingly used to form a working, persistent memory for both traditional "memory" and "storage" functions.

DETAILED DESCRIPTION

Techniques and systems are disclosed herein for purposes of forming a resistance ratio-based memory cell from multiple resistive storage elements and forming an array of such memory cells. More specifically, in accordance with example implementations, a given memory cell is constructed from a pair of resistive storage elements, and a resistance ratio of these resistive storage elements indicates a value (logic one or a logic zero value, for example) that is stored by the memory cell.

In this context, a "resistive storage element" generally refers to a non-volatile element whose resistance indicates a stored value and which may be read or sensed (via a current, for example) to retrieve the stored value. Moreover, the state of the element may be changed/programmed via the voltage to cause the element to have a certain resistance and correspondingly set the value that is stored by the element. A bipolar Memristor cell, or resistive random access memory (RRAM) cell, is one example of such a resistive storage element, as further described herein. However, the systems and techniques that are disclosed herein may be used with other resistive storage elements, such as a unipolar RRAM cell, a phase change random access memory cell (PCRAM), a magnetoresistive random access memory cell (MRAM), and so forth.

Figure 1:
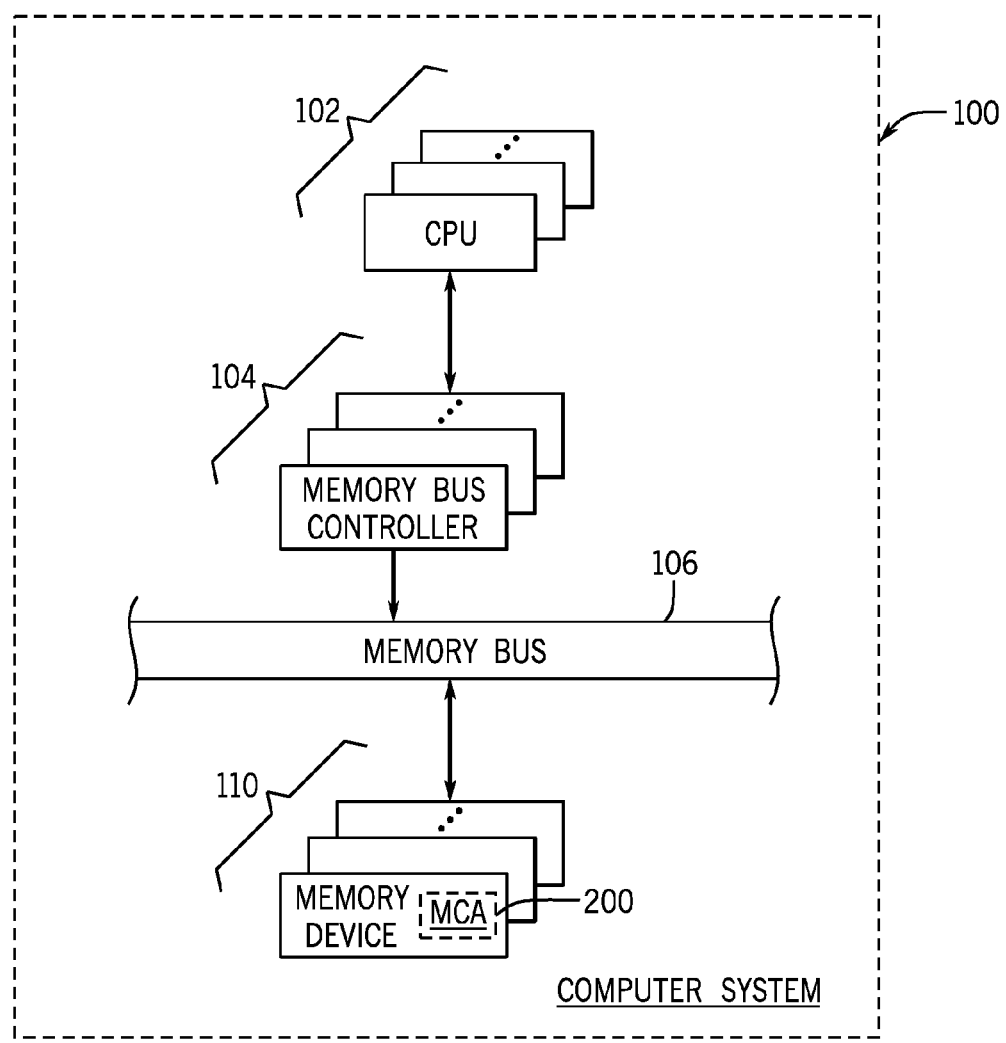
FIG. 1 is a schematic diagram of a computer system according to an example implementation.

Referring to FIG. 1, a memory cell array 200 that is formed from resistive storage elements may form part of a memory device 110 of a computer system 100 that is generally illustrated in FIG. 1. Referring to FIG. 1, the computer system 100 is a physical machine that is made up of actual hardware and actual software (i.e., machine executable instructions). In this regard, the computer system 100 may include one or multiple central processing units (CPUs); and each CPU 102 may include one or multiple processing cores. In this regard, the CPU 102 may be packaged inside a particular semiconductor package, which is constructed to be mechanically and electrically mounted to a motherboard of the computer system 100 via an associated connector, or socket. In this manner, the socket may be constructed to receive at least a portion of this semiconductor package, which contains the package's electrical contacts, and the socket has mechanical features to secure the semiconductor package to the socket. As a more specific example, in accordance with example implementations, the CPU 102 may be contained in a surface mount package, which has a land grid array (LGA) for purposes of forming electrical connections with corresponding pins of the receiving socket. Other semiconductor packages may be employed, in accordance with further example implementations.

As further depicted in FIG. 1, the computer system 100 may include one or multiple memory controllers 104. In this manner, in accordance with example implementations, one or multiple memory controllers 104 may be integrated into a given CPU 102 to allow processing core(s) of the CPU 102 to access one or multiple memory modules of the computer system 100 via a memory bus 106. Each memory module may include one or more of the memory devices 110.

Figure 2:
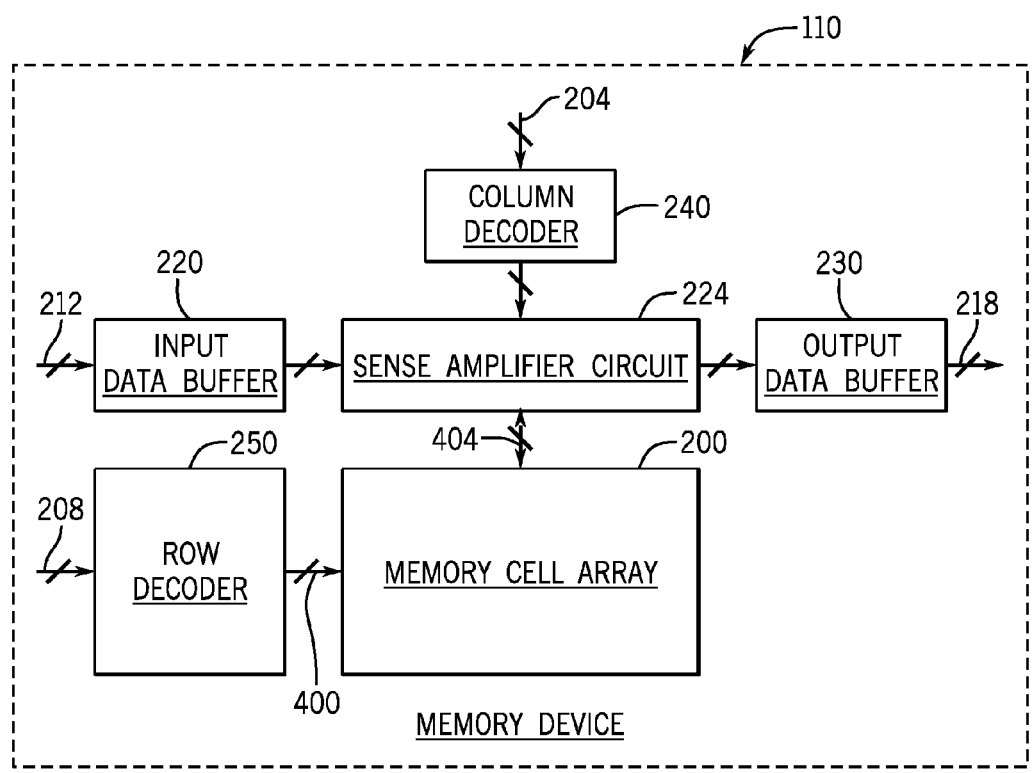
FIG. 2 is a schematic diagram of a memory device of the computer system of FIG. 1 according to an example implementation.
Figure 4:
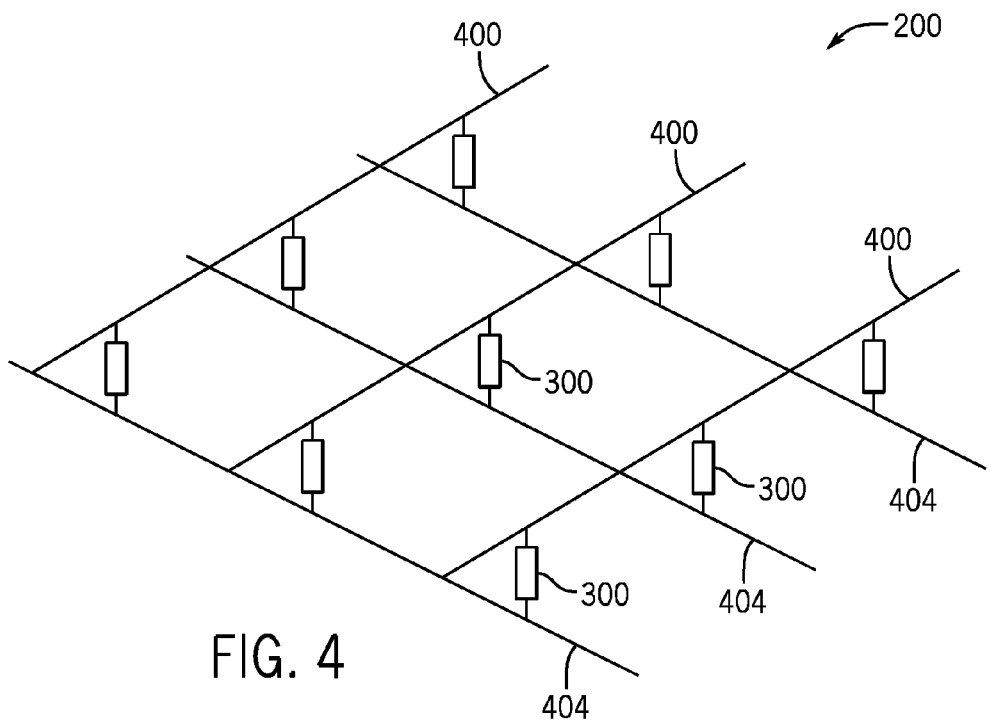
FIGS. 4, 6, 7 and 8 are illustrations of crosspoint memory cell arrays according to example implementations.

Referring to FIGS. 2 and 4, the memory cell array 200, in accordance with example implementations, is a crosspoint array that includes row lines 400 and column lines 404. The array 200 includes memory cells 300 that are associated with the intersections of the row and column lines. In this manner, in general, a given memory cell 300 of the memory cell array 200 may be accessed (for purposes of reading a value from the cell or writing a value to the cell) by the row and column line pair that corresponds to the cell 300.

A targeted set of memory cells for a given memory operation is selected by column and row address signals that are received by the memory device 110. Referring to FIG. 2, in general, the memory device 110 includes a column decoder 240, which receives column address signals at its input terminals 204 in connection with targeted memory cells and decodes these signals to generate signals to select the corresponding column lines 404 of the memory cell array 200. The memory device 110 further includes a row decoder 250, which decodes row address signals at its input terminals 208 to generate signals to select the appropriate row line 400 of the memory cell array 200.

As depicted in FIG. 2, the memory device 110 further includes an input data buffer 220, which receives input data (via input terminals 212) associated with write operations. In accordance with example implementations, for a write operation, the input data may be communicated to a sense amplifier circuit 224 of the memory device 110, which generates the appropriate programming voltages on memory cells that are targeted by the write operation for purposes of writing values to the cells 300. For a read operation, the sense amplifier circuit 224 senses values stored in the memory cells 300 that are targeted by the read operation to form corresponding values that are stored in an output data buffer 230. In this manner, the read data may be retrieved from output terminals 218 of the output data buffer 230.

It is noted that the memory device architecture of FIG. 2 is merely a simplified example of example components of the memory device 110, as the memory device 110 may have other architectures and other components, in accordance with further implementations.

Figure 3A:
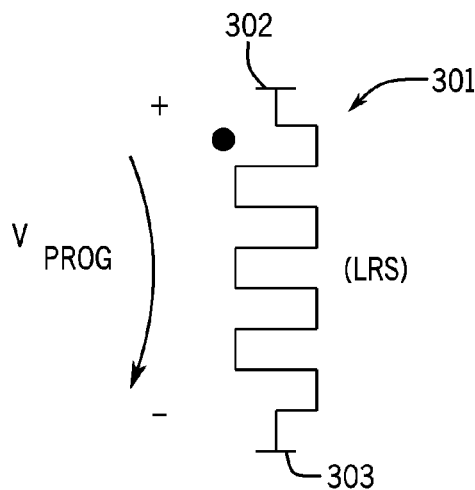
FIG. 3A is an illustration of programming a resistive storage element to have a low resistance state (LRS) according to an example implementation.
Figure 3B:
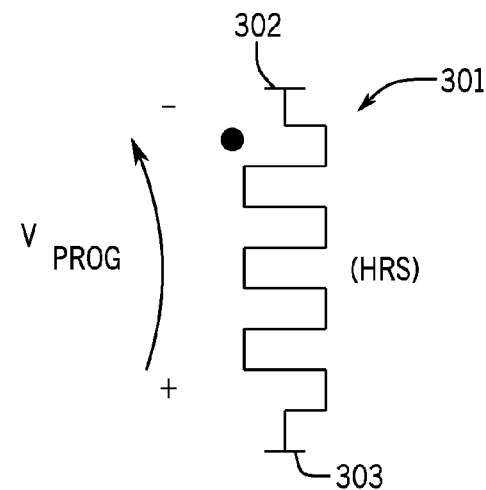
FIG. 3B is an illustration of programming a resistive storage element to have a high resistance state (HRS) according to an example implementation.

As described herein, the cells 300 (see FIG. 4) of the memory cell array are FIGS. 3A and 3B illustrate states of an example resistive storage element 301 for implementations in which the element 301 is a bipolar Memristor. For these example implementations, the resistive storage element 301 may be programmed to exhibit either a low resistance state (LRS) by applying a positive programming voltage (called "$V_{PROG}$") between the top 302 and bottom 303 electrodes of the element 301 (as illustrated in FIG. 3A) or exhibit a high resistance state (HRS) by applying a negative $V_{PROG}$ programming voltage between the top 302 and bottom 303 electrodes (as illustrated in FIG. 3B). The absolute magnitude of the $V_{PROG}$ programming voltage is higher than the absolute magnitude of a read voltage, which may be applied in either direction across the element 301 for purposes of sensing the element's resistance (i.e., sensing whether the element 301 is in the LRS or in the HRS).

Referring to FIG. 4, although the memory cells 300 may be formed from single resistive storage elements (such as element 301 of FIGS. 3A and 3B), such an arrangement may be prone to "sneak" currents, which are non-ideal currents that exist in the non-selected memory cells. Moreover, a crosspoint array having memory cells that are formed from single resistive storage elements may potentially be vulnerable to individual cell defects, such that a single defective memory cell may adversely affect the operation of multiple cells of the array. For example, if a given memory cell 300 incurs an electrical short, this short gathers and increases the sneak current, which may prevent the associated row, associated column, potentially associated area, and maybe even the entire crosspoint array from being accessed. Techniques and systems are disclosed herein, however, for purposes of improving the robustness of the array for purposes of surviving such memory cell defects. More specifically, in accordance with example implementations, the memory cell 300 is formed from multiple resistive storage elements, and the ratio of the resistances of these elements indicate the value that is stored by the cell 300.

Figure 5A:
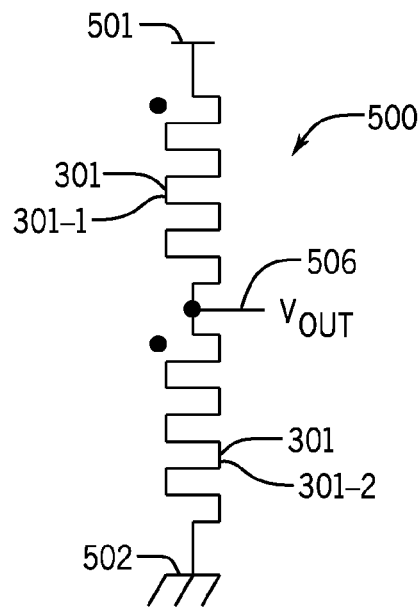
FIGS. 5A and 5B are illustrations of resistance ratio-based memory cells according to example implementations.

In accordance with example implementations, FIG. 5A illustrates a resistance ratio-based memory cell 500 that is formed from two resistive storage elements 301 (a top element 301-1 and a bottom element 301-2), which are serially coupled together between top 501 and bottom 502 electrodes of the cell 500 to form a voltage divider. In this manner, for this example, the resistive storage elements 301 have the same polarity, and a node 506 at which the elements 301 are coupled together provides a voltage (called "$V_{OUT}$"), which indicates a resistance ratio (i.e., the stored value) for the cell 500.

In general, for a given state of the memory cell 500, one of the resistive storage elements 301 has a HRS, and the other element 301 has an LRS. As such, the state of the memory cell 500 depends on which resistive storage element 301 is in the LRS and which resistive storage element 301 is in the HRS. For example, the memory cell 500 may store a logic one when the top resistive storage element 301-1 is in the HRS and the bottom resistive storage element 301-2 is in the LRS; and conversely, the memory cell 500 may store a logic zero when the top resistive storage element 301-1 is in the LRS and the bottom resistive storage element 301-2 is in the HRS. The logic one and zero states may be represented by resistances states opposite to those described in the foregoing example, in accordance with further implementations.

A particular advantage of using a ratio of resistances to indicate a stored value for a memory cell is that such a memory cell is self-referencing, as the difference between the resistances and not the absolute resistances, indicate the stored value.

Figure 5B:
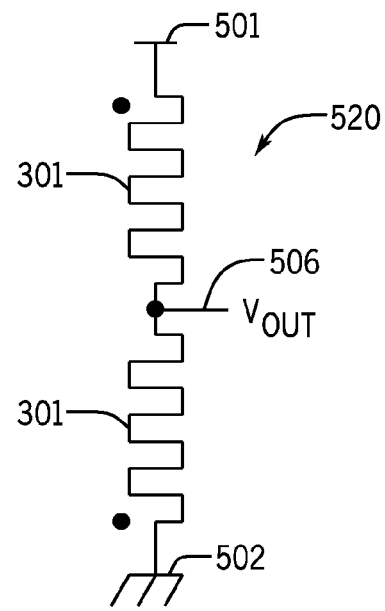

The resistive storage elements 301 of the memory cell 500 of FIG. 5A have the same polarity. However, as depicted in FIG. 5B, in accordance with further example implementations, a resistance ratio-based memory cell 520 may be formed from serially coupled resistive storage elements 301 that have opposite polarities.

Figure 6:
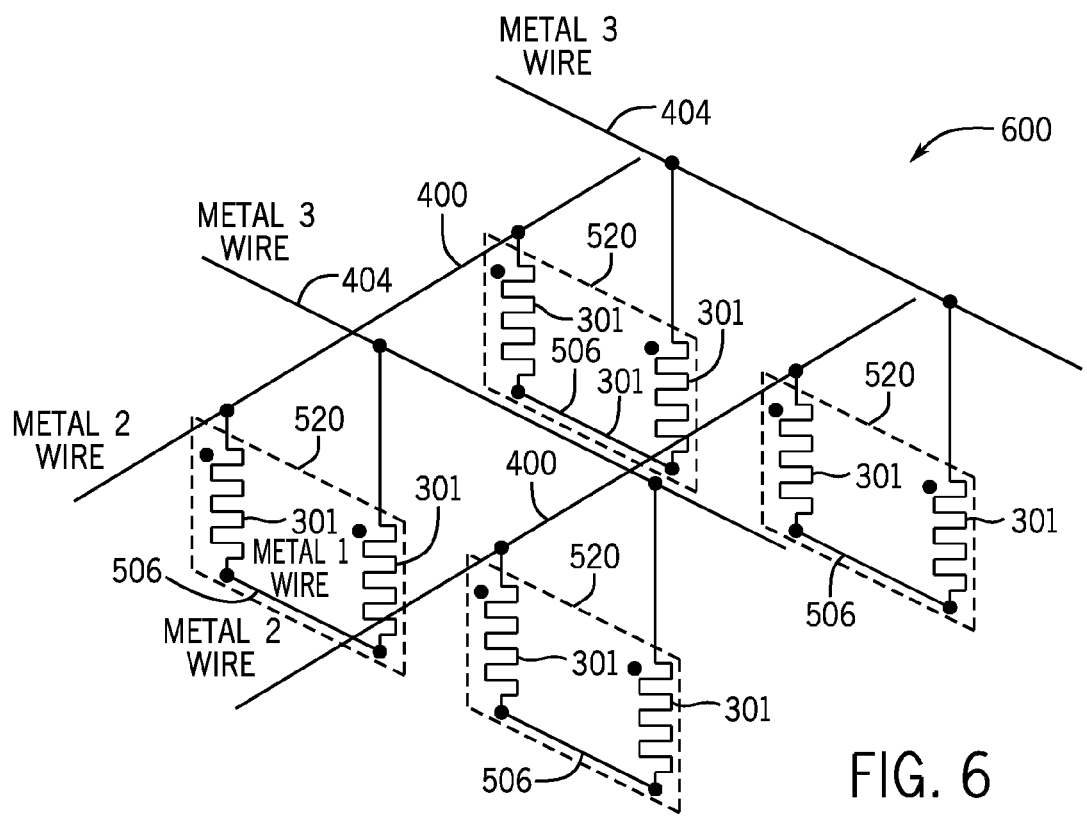

A memory cell 520 that is constructed from resistive storage elements 301 that have opposite polarities may be particularly advantageous for manufacturing, as it may be relatively easier to fabricate the resistive storage elements 301 of the cell 520 in the same fabrication layer. In this manner, FIG. 6 illustrates an example crosspoint memory cell array 600 that includes the memory cells 520. The nodes 506, column lines 404 and row lines 400 for this example are formed from metal layers one, two and three, respectively of the semiconductor fabricated devices.

Figure 7:
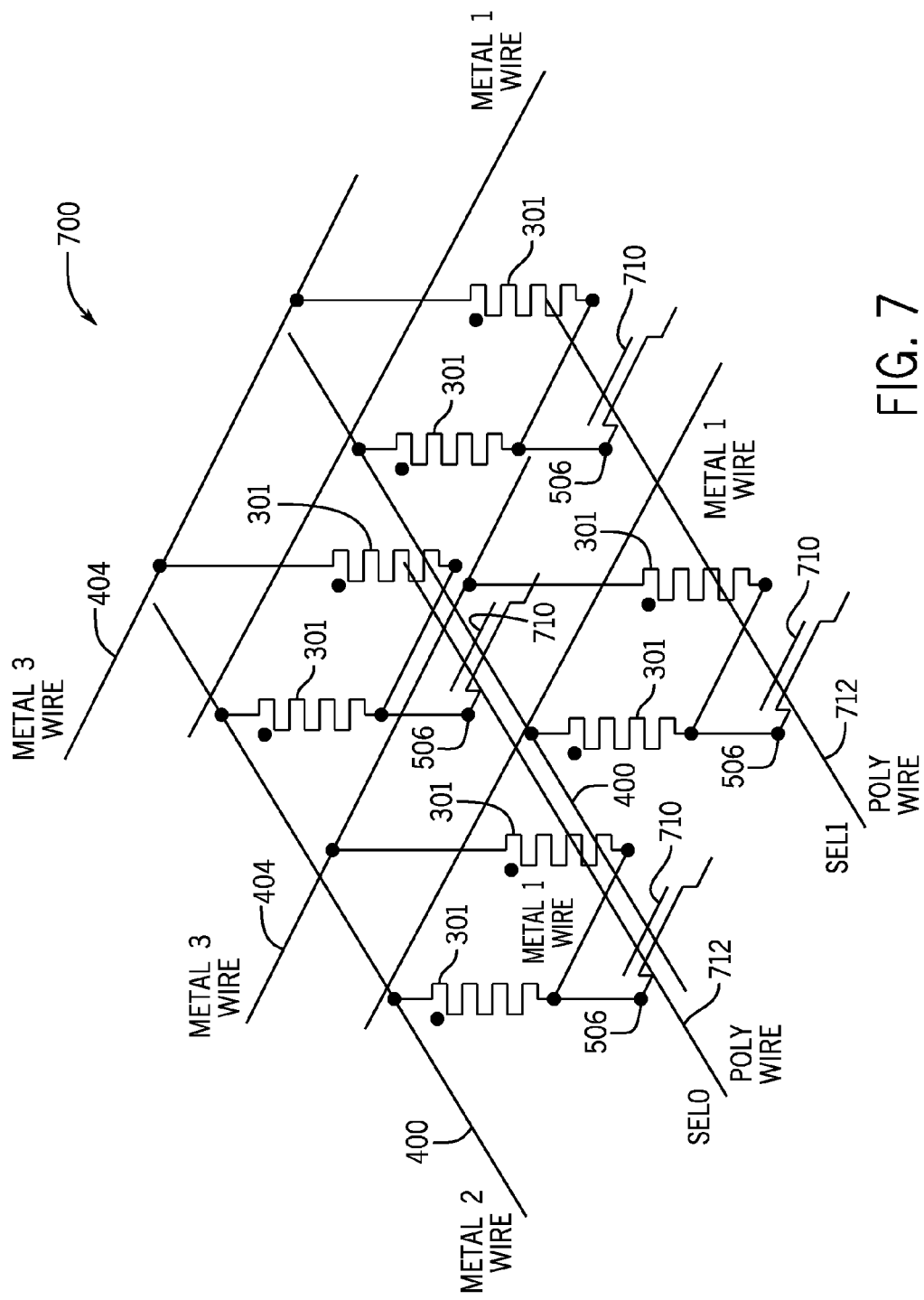

Referring to FIG. 7 that depicts an example memory, in accordance with example implementations, the values that are stored in the memory cells may be directly sensed. In this regard, for this example implementation, the array 700 includes transistors 710 (metal-oxide-semiconductor field-effect-transistors (MOSFETs), for example). For example, the transistors 710 may serve as pass gates to selectively couple the nodes 506 associated with a selected row to column sense amplifiers (not shown). Moreover, for this example, gate terminals of transistors 710 that are associated with the same row are coupled to a poly wire 712 for purposes of reading values of the memory cells for that row. It is noted that in this arrangement, the row 400 and column 404 lines alternate on the cell's top electrodes, meaning that an additional layer of interconnect metal (and associated via layer) is used, which consumes more resources and may make it challenging to stack layers. Moreover, the common node 506 is routed out of the crosspoint for reading, which makes the arrangement challenging for larger arrays; and using the select transistor 710 of FIG. 7 may significantly impact the density of the memory cell array 700.

Figure 8:
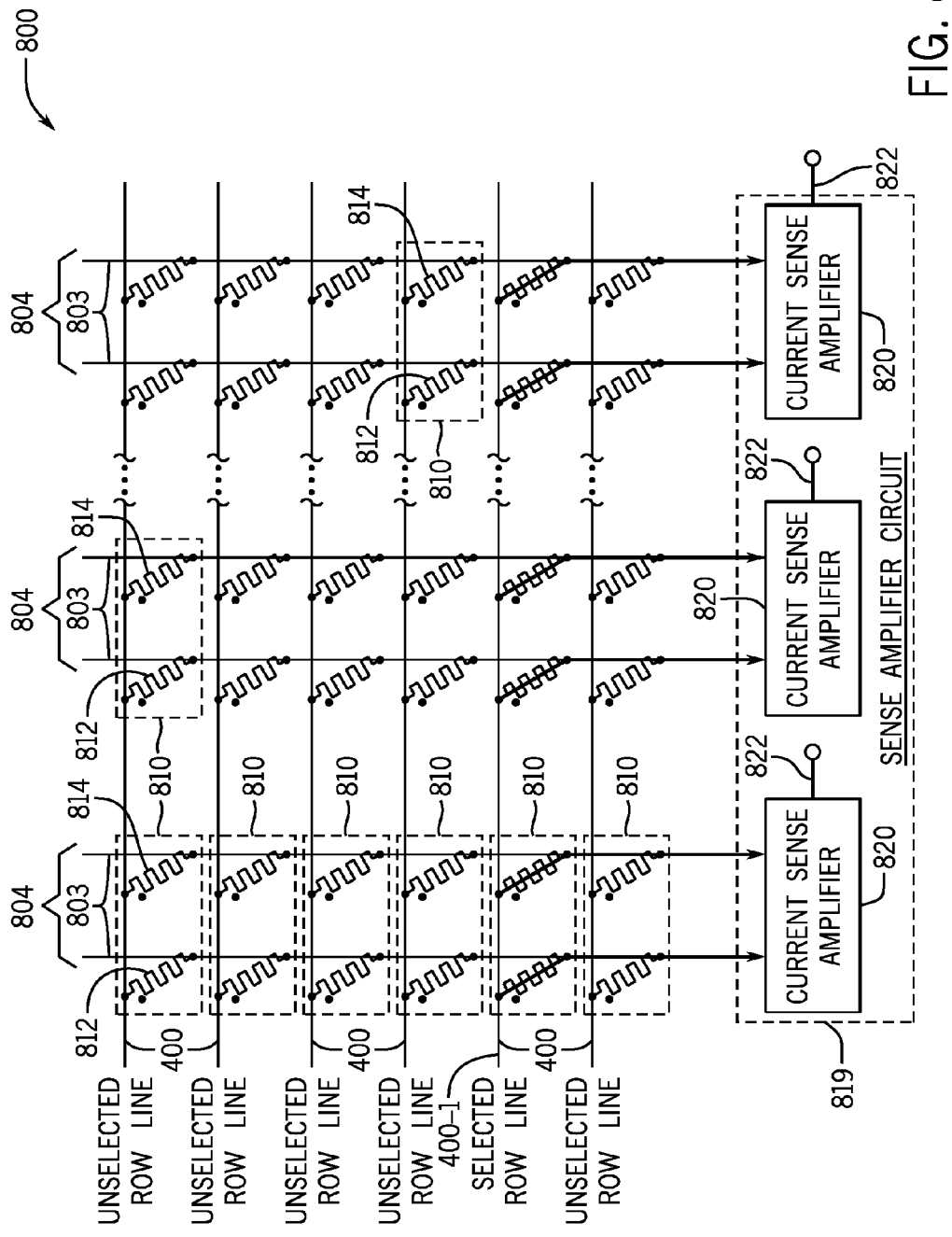

Therefore, in accordance with further example implementations, the resistive storage elements of each resistance ratio-based memory cell may not be connected together at the bit cell, but rather, the resistive elements may be indirectly compared at the respective column's sense amplifier during the appropriate row's read. More specifically, referring to FIG. 8, in accordance with some example implementations, a memory cell array 800 includes pairs 804 of column lines 803, and each column line pair 804 is associated with a column of memory cells 810. Each memory cell 810, in turn, includes a pair of resistive storage elements 812 and 814 whose resistance ratio indicates a stored value for the cell 801. As depicted in FIG. 8, in accordance with example implementations, the resistive storage elements 812 and 814 have the same polarity.

For a given memory cell 810, the resistive element 812 is coupled between a given row line 400 and one of the column lines 803 of the pair 804, with the other resistive element 814 being coupled between the same row line 400 and the other column line 803 of the pair 804. Current sense amplifiers 820 are coupled to columns of the memory cells 810 such that for read operation, a given current sense amplifier 820 provides (at node 822) a voltage that indicates the stored value for the memory cell 810 of the column associated with the selected row. It is noted that the memory device may further include (not shown) circuitry that is coupled to the column lines 803 to cause the appropriate programming voltages to be applied across the resistive elements 812 and 814 during a write operation.

For purposes of reading the values stored by a given row of memory cells 810, the row decoder applies a read voltage to the selected row line, such as selected row line 400-1 for this example; and this read voltage produces currents in the column lines for the selected memory cells 810. Each current sense amplifier 820 responds to the differences in currents between the resistive elements 812 and 814 of the corresponding memory cell 810 to indicate the stored value for the cell 810.

Figure 9A:
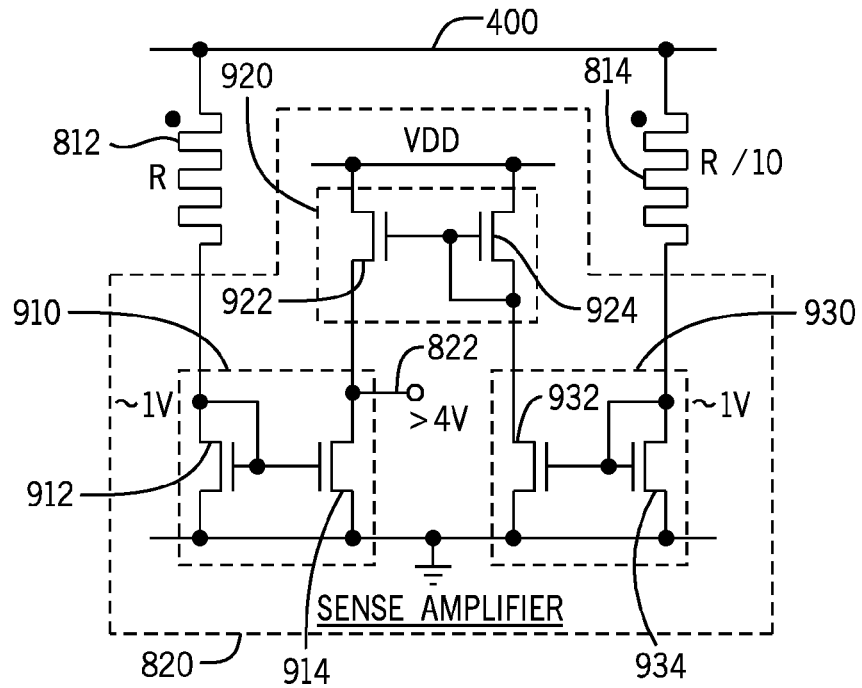
FIG. 9A is a schematic diagram of a folded current sense amplifier illustrating the use of the amplifier to read a logic one value stored by a resistance ratio-based memory cell according to an example implementation.

More specifically, FIG. 9A depicts the current sense amplifier 820 for the example in which the amplifier 820 senses a logic one (as an example) stored in the cell 810. In general, the current sense amplifier 820 in this example implementation is a folded sense amplifier, which includes a first current mirror 910 that receives a current in the resistive element 812 and mirrors this current to a current mirror 920. In a similar fashion, the sense amplifier 820 includes a current mirror 930 that receives a current in the resistive element 814 and mirrors this current to the current mirror 920. The stronger current of those from 922 or from 914 controls whether the voltage on the node 822 is pulled high or low. More specifically, as illustrated in FIG. 9A, for the case in which the resistive element 812 is in the HRS and the resistive element 814 is in the LRS, the node 822 is pulled high to indicate a logic one (as an example) for the cell 810.

Figure 9B:
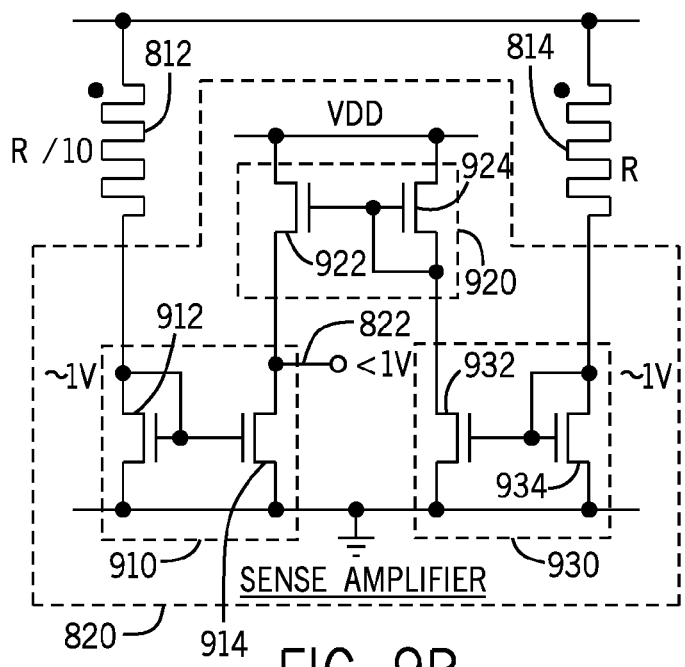
FIG. 9B is a schematic diagram of the sense amplifier illustrating use of the amplifier to read a logic zero stored by the memory cell according to an example implementation.

FIG. 9B illustrates the case in which the memory cell 810 is programmed in the opposite, logic zero state. For this state, the resistive element 812 is in the LRS, and the resistive element 814 is in the HRS. As shown in FIG. 9B, this causes the node 822 to be pulled low to indicate a logic one for the corresponding memory cell 810.

In accordance with example implementations, the current mirror 910 may be formed from a n-channel metal oxide semiconductor field effect transistor (nMOSFET) 912, which is used as a MOSFET diode. In this manner, the drain and gate terminals of the nMOSFET are coupled together, the source terminal coupled to ground and its gate terminal also coupled to the gate terminal of another nMOSFET 914. The source terminal of the nMOSFET 914 is coupled to ground, and the drain terminal of the nMOSFET 914 is coupled to the node 822. The current mirror 920 includes a p-channel MOSFET 922 (pMOSFET), which has its drain terminal coupled to the node 822 and its source terminal coupled to a voltage supply rail (called "$V_{DD}$," in FIGS. 9A and 9B), and the gate terminal of the pMOSFET 922 is coupled to the gate terminal of a pMOSFET 924 that is coupled as a MOSFET diode. The source terminal of the pMOSFET 924 is also coupled to the $V_{DD}$ supply rail, and the gate terminal of the pMOSFET 924 is coupled to its drain terminal.

The drain terminal of the pMOSFET 924 is also coupled to the drain terminal of an nMOSFET 932 of the current mirror 930. The source terminal of the nMOSFET 932 is coupled to ground, and the gate terminal of the nMOSFET 932 is coupled to the gate terminal of an nMOSFET 934 of the current mirror 930, which forms a MOSFET diode. The gate and drain terminals of the nMOSFET 934 are coupled together, and the gate and drain terminals of the nMOSFET 934 are coupled to the resistive element 814.

It is noted that the sense amplifier 820 may have other topologies, in accordance with further example implementations.

Figure 10:
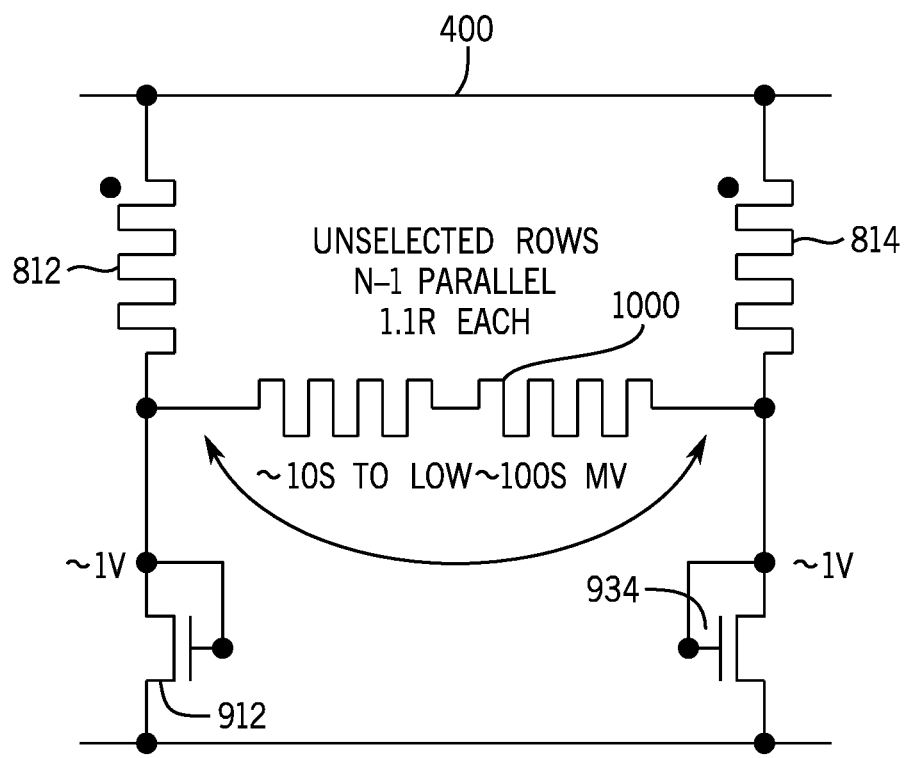
FIG. 10 is a schematic diagram illustrating the effect of unselected rows on the operation of the sense amplifier according to an example implementation.

FIG. 10 depicts a path 1000 between the resistive elements 812 and 814 of unselected memory cells. Negligible current exists in the path 1000 because, as illustrated in FIG. 10, the voltage of the drain of the NMOSFET 912 is significantly close to the voltage of the drain of the NMOSFET 934. This greatly reduces the sneak current in the array.

Figure 11:
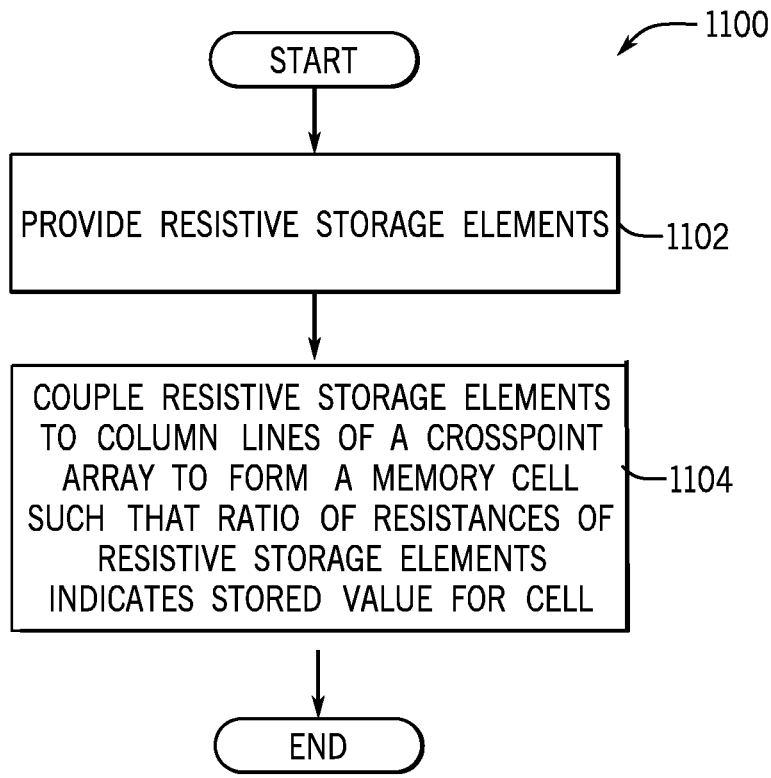
FIGS. 11 and 12 are flow diagrams illustrating techniques to use resistive storage elements to form memory cells and memory cell arrays according to example implementations.
Figure 12:
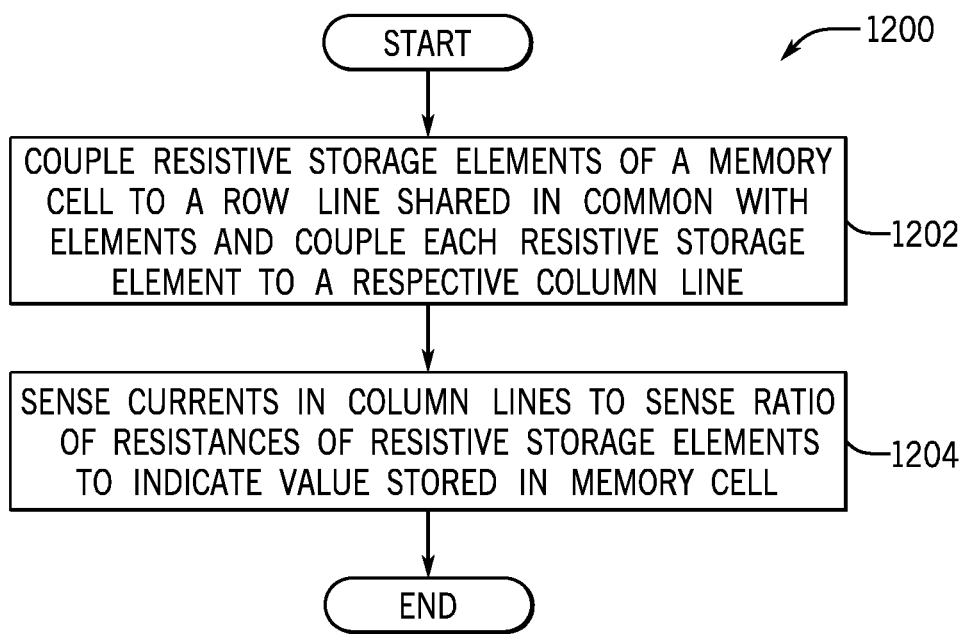

Thus, to summarize, referring to FIG. 11, in general, a technique 1100 includes providing (block 1102) resistive storage elements and coupling the resistive elements to column lines of a crosspoint array to form a memory cell such that a ratio of resistances of the resistive storage elements indicates a stored value for the cell, pursuant to block 1104. More specifically, referring to FIG. 12, a technique 1200 includes coupling resistive storage elements of a memory cell to a row line that is shared in common with the elements and coupling each resistive storage element to a respective column line, pursuant to block 1202. Pursuant to block 1204, the currents in the column lines are sensed to a sense a ratio of resistances of the resistive storage elements to indicate a value that is stored in the memory cell.

Among the advantages of the systems and techniques that are disclosed herein, the bit cells are self-referencing. A read margin signal-to-noise ratio (SNR) is enhanced. A single cell does not tie a bit line with a word line and cause the row, column or array to fail. Strongly correlated process variations with the two resistive elements lead to a tighter distribution of the resistance ratios. Cell density is not sacrificed. In the case of "sticky" or cells that are otherwise out of specification, neighboring cells may be conceivably adjusted by write circuitry to still produce correct reads. Other and different advantages are contemplated, which are within the scope of the appended claims.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:
1. An apparatus comprising:
a plurality of column lines;
a plurality of row lines;
a plurality of sense amplifiers; and a plurality of memory cells;
wherein:
a given memory cell of the plurality of memory cells comprises a first resistive storage element coupled to a first column line of the plurality of column lines and a second resistive storage element coupled to a second column line of the plurality of column lines;
a given sense amplifier of the plurality of sense amplifiers is coupled to the first and second column lines to provide an indication of a value stored by the given memory cell when the given memory cell is selected, and
the given sense amplifier includes a first current mirror, a second current mirror, and a third current mirror, where the first current mirror is to mirror a first current from the first column line to the third current mirror and the second current mirror is to mirror a second current of the second column line to the third current mirror such that a voltage of an output node is pulled low or high based on which one of the first and second currents is larger.

2. The apparatus of claim 1, wherein, in response to the given memory cell being selected, the first resistive storage element receives a read voltage and the second resistive storage element receives the read voltage; and a voltage of the output node of the given sense amplifier provides the indication of the value stored by the given memory cell.

3. The apparatus of claim 1, wherein one of the first and second resistive storage elements is in a high resistance state in response to the other of the first and second resistive storage elements being in a low resistance state.

4. The apparatus of claim 1, wherein failure of either the first resistive storage element or the second resistive storage element does not affect an integrity of the plurality of memory cells other than the given memory cell.

5. The apparatus of claim 1, wherein the first resistive storage element has a high resistance state and the second resistive storage element has a low resistance state to indicate a first logic value for the given memory cell, and the first resistive storage element has a low resistance state and the second resistive element has a high resistance state to indicate a second logic value for the given memory cell different from the first logic value.

6. The apparatus of claim 1, wherein the first resistive storage element has a first polarity and the second resistive storage element has a second polarity the same as the first polarity.

7. The apparatus of claim 1, wherein the first resistive storage element has a first polarity and the second resistive storage element has a second polarity opposite from the first polarity.

8. An apparatus comprising:
a first resistive storage element with a first end connected to a row line and a second end connected to a first column line;
a second resistive storage element with a first end connected to the row line and a second end connected to a second column line, the first and second resistive storage element forming a memory cell; and
a sense amplifier comprising a first current mirror, a second current mirror, and a third current mirror, where the first current mirror is to mirror a first current from the first column line to the third current mirror and the second current mirror is to mirror a second current of the second column line to the third current mirror such that a voltage of an output node is pulled low or high based on which one of the first and second currents is larger.

9. The apparatus of claim 8, further comprising:
driving circuitry that is to:
store a first logic value in the memory cell by reversibly setting the resistance state of the first resistive storage element to a high resistance state and reversibly setting the resistance state of the second resistive storage element to a low resistance state, and
store a second logic value in the memory cell by: reversibly setting the resistance state of the first resistive storage element to the low resistance state and reversibly setting the resistance state of the second resistive element to the high resistance state.

10. The apparatus of claim 8, further comprising:
driving circuitry that is to read a value stored in the memory cell by detecting the voltage of the output node of the sense amplifier while applying a voltage difference between the row line and the first column line and between the row line and the second column line.

11. The apparatus of claim 8,
wherein the sense amplifier is to maintain potentials of the first and second column line substantially equal to each other.

12. The apparatus of claim 8,
wherein the first resistive storage element has a first polarity and the second resistive storage element has a second polarity the same as the first polarity.

13. The apparatus of claim 8,
wherein the first resistive storage element has a first polarity and the second resistive storage element has a second polarity opposite from the first polarity.

* * * * *